United States Patent
Takano et al.

(10) Patent No.: US 9,929,581 B2
(45) Date of Patent: Mar. 27, 2018

(54) CHARGE CONTROL DEVICE AND CHARGE CONTROL METHOD

(71) Applicant: NISSAN MOTOR CO., LTD., Yokohama-shi, Kanagawa (JP)

(72) Inventors: Atsushi Takano, Sagamihara (JP); Kenji Hosaka, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 206 days.

(21) Appl. No.: 14/427,018

(22) PCT Filed: Sep. 10, 2013

(86) PCT No.: PCT/JP2013/074394
§ 371 (c)(1),
(2) Date: Mar. 10, 2015

(87) PCT Pub. No.: WO2014/045942
PCT Pub. Date: Mar. 27, 2014

(65) Prior Publication Data
US 2015/0236524 A1    Aug. 20, 2015

(30) Foreign Application Priority Data

Sep. 24, 2012   (JP) ................. 2012-209193

(51) Int. Cl.
*H02J 7/04* (2006.01)
*H02J 7/00* (2006.01)
*G01R 31/36* (2006.01)

(52) U.S. Cl.
CPC .......... *H02J 7/007* (2013.01); *G01R 31/3634* (2013.01); *G01R 31/3675* (2013.01)

(58) Field of Classification Search
CPC ..................................... H02J 7/007
USPC ................................. 320/150–155
See application file for complete search history.

(56) References Cited

U.S. PATENT DOCUMENTS

| 2012/0013301 A1 | 1/2012 | Gaul et al. |
| 2012/0049806 A1 | 3/2012 | Saito |
| 2012/0249088 A1 | 10/2012 | Abe |

FOREIGN PATENT DOCUMENTS

| CN | 101779099 A | | 7/2010 |
| CN | 102540088 A | | 7/2012 |
| EP | 2187499 A1 | | 5/2010 |
| EP | 2204872 | * | 7/2010 |
| EP | 2204872 A1 | | 7/2010 |

(Continued)

*Primary Examiner* — Richard V Muralidar
(74) *Attorney, Agent, or Firm* — Young Basile Hanlon & MacFarlane, P.C.

(57) ABSTRACT

A charge control device that charges a battery to a predetermined charging rate using an output power from a charger includes a charger control means that controls the output power of the charger based on a first map indicative of the relationship of the charge power with respect to the state of the battery and the charge time of the battery, and an allowable charge time calculation means that calculates the allowable charge time of the battery charge time. The charge control device refers to the first map for calculating the charge power with which to charge the battery in the allowable charge time, and controls the output power of the charger according to the charge power calculated based on the allowable charge time.

12 Claims, 7 Drawing Sheets

(56) References Cited

FOREIGN PATENT DOCUMENTS

| | | |
|---|---|---|
| JP | H1189105 A | 3/1999 |
| JP | 2001314046 A | 11/2001 |
| JP | 2002-374635 A | 12/2002 |
| JP | 2012046121 A | 3/2012 |
| JP | 2012519466 A | 8/2012 |
| JP | 2012210130 A | 10/2012 |
| WO | 2012101496 A2 | 8/2012 |

\* cited by examiner

CHARGE CONTROL DEVICE AND CHARGE CONTROL METHOD

CROSS REFERENCE TO RELATED APPLICATION

The present application claims priority to Japanese Patent Application No. 2012-209193, filed Sep. 24, 2012, incorporated herein in its entirety.

TECHNICAL FIELD

The present invention relates to a charge control device and a charge control method.

BACKGROUND

A charge device for a battery pack is known in which, by measuring a battery with the highest battery temperature among a plurality of secondary batteries constituting a battery pack, and, when the highest battery temperature is detected to be lower than a boundary temperature Tc, charging is to be effected is charged at a constant current value A1, while, when the highest battery temperature is higher than the boundary temperature Tc, the charging is carried out with a current value A2 set smaller than the current value A1 (see, for example, Japanese Patent Application Publication No. 2001-314046).

However, in the charge device described above, since the charge current of the battery is set only based a battery temperature, when the battery temperature is high and the battery is charged with a small current value, it takes too much charging time so that the user will be given a discomfort.

SUMMARY

The object the present invention intends to resolve is to provide a charge control device and a charge control method which is able to charge a battery in the charging time that will not give the user the uncomfortable feeling.

According to the present invention, the object described above is achieved by referring to a map indicative of the relationship of the charge power with respect to the state of the battery and a battery charge time and by calculating a charge power with which to charge the battery in a calculated allowable charge time, the output power of a charger is controlled by the calculated charge power.

According to the present invention, by calculating a charge power to end charging within the allowable or permissible time and controlling charge of the battery, the battery is prevented from being charged beyond the allowable charge time so that it is possible to prevent the user from being given discomfort due to too much time of charging.

BRIEF DESCRIPTION OF THE DRAWINGS

FIG. 6A is a graph showing, in the battery of FIG. 1, characteristics of charge power against the charge time, while FIG. 6B is a graph showing characteristics of the battery temperature with respect to charge time;

DETAILED DESCRIPTION OF THE EMBODIMENTS

A description is given of an embodiment according to the present invention with reference to the drawings.

Figure 1:
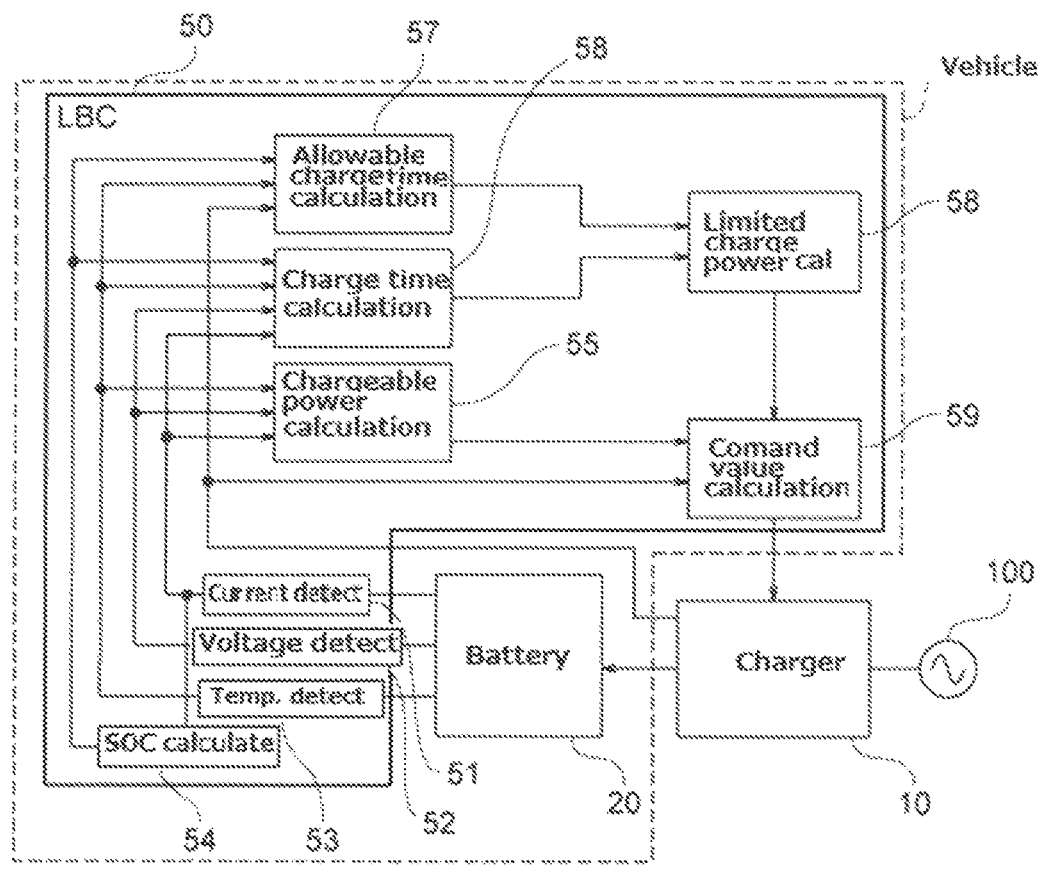
FIG. 1 is a block diagram of a charge system in an embodiment according to the present invention.

FIG. 1 is a block diagram of a charge system of the charge control device in an embodiment according to the present invention. The charge system in the present embodiment is intended for a charge system for charging a battery mounted on a vehicle such as an electric vehicle, a plug-in hybrid vehicle, etc. The charge control device is a part of a configuration of a charging system, which is mounted on the vehicle or the like.

The charge system of the present embodiment includes a battery 20 and a LBC (Lithium-ion battery controller) 50. The battery 20 and the LBC50 are mounted on the vehicle. Note that, though not shown in FIG. 1, a vehicle equipped with the charge control device is provided with a configuration such as an electric motor in addition to the battery 20, etc.

A charger 10 is provided for charging the battery 20, which is provided outside the vehicle. The charger 10 is a charge circuit for outputting to the battery 20 an electric power suitable for charging the battery 20, on the basis of the control of the LBC50, by converting the power input from the AC power supply 100. The charger 16 is provided with an inverter, a DC/DC converter, and a controller or the like. The charger 10 is connected to the battery 20 by a cable or the like.

The battery 20 is composed of a plurality of secondary batteries (hereinafter, also referred to as cells) connected to each other and serving as a power source of the vehicle. The battery 20 is connected to a motor (not shown) via an inverter (not shown). The battery is charged by regeneration of the motor or by the charger outside the vehicle.

The LBC (Li-ion battery controller) 50 is a controller that measures the SOC and the like of the battery 20 based on detection values of a voltage sensor and a current sensor connected to the battery 20 for managing the states of the battery 20 such as a charged capacity to the battery 20 and the like. Further, the LBC 50 communicates control signals with the charger 10 and controls charging of the battery by controlling the charger 10.

The LBC 50 is provided with a current detecting unit 51, a voltage detecting unit 52, a temperature detecting unit 53, a SOC calculation unit 54, a chargeable power calculation unit 55, a charge time calculation unit 56, an allowable charge time calculation unit 57, a limited charge power calculation unit 58, and a command value calculation unit 59.

The current detecting unit 51 is a sensor connected to the battery 20 for detecting the current of the battery 20. The detection value of the current detecting unit 51 is output to the SOC calculation unit 54, the chargeable power calculation unit 55, and the charge time calculation unit 56.

The voltage detecting unit 52 is connected to the battery 20 and intended to be a sensor that detects the voltage of the battery 20. The voltage detecting unit 52 detects each voltage of a plurality of the battery cells in the battery 20, and detects the total voltage of the plurality of batteries. The detected values of the current detecting unit 52 are outputted to the chargeable power calculation unit 55 and the charge time calculation unit 56.

The temperature detecting unit 53 is disposed in the battery 20 and intended to be a sensor for detecting the temperature of the battery 20. The detection value of the temperature detecting unit 51 is output to the chargeable power calculation unit 55, the charge time calculation unit 56, and the allowable charge time calculation unit 57.

The SOC calculation unit 54 calculates the SOC of the battery 20, by integrating the detected value detected by the current detecting unit 51, i.e., by integrating the charge current so as to obtain the SOC of the battery 20. The SOC calculation unit 54 outputs the calculated SOC to the charger time calculation unit 56 and the allowable charge time calculation unit 57.

Note that the SOC calculation unit 54 may calculate the SOC of the battery 20 from the detected voltage of the voltage detecting unit 52. Since the voltage of the battery 20 and the SOC are correlated, a map indicating the correlation is stored in a memory 40. The SOC calculation unit 54, by referring to the map in the memory 40, calculates the SOC corresponding to the detected value of the voltage detecting unit 52 as the SOC of the battery 20.

Note that, since the correlation between the voltage the battery 20 and the SOC varies depending on the degree of deterioration of the battery 20, the map may be prepared in accordance with the degree of deterioration of the battery 20. The degree of deterioration of the battery 20 may be calculated from the internal resistance of the battery 20, for example. Also, the internal resistance of the battery 20 may be calculated using the change in current detected by the current detecting unit 51 and the change in voltage detected by the voltage detecting unit 52.

The chargeable power calculation unit 55 calculates a chargeable power of the battery 20 based on the detected current of the current detecting unit 51, the detected voltage of the voltage detecting unit 52, and the detected temperature of the temperature detecting unit 53. The chargeable power means a maximum power, during charging of the battery 20, with which the battery may be charged without promoting deterioration of the battery 20, i.e., the maximum input power inputtable from the charger 10 to the battery 20. Note that the chargeable power is generally referred to an inputtable power, maximum chargeable power, or maximum inputtable power, as well. In the present embodiment, it is described as the chargeable power. The chargeable power calculation unit 55 calculates the chargeable power in the manner described below.

With respect to the battery 20, according to the performance of the battery 20, a charge voltage upper limit is set for each cell. The charge voltage upper limit is intended to be such a voltage upper limit at which the battery 20 is charged without causing deterioration of the battery 20. The charge voltage upper limit is set to a voltage equal to or lower than that voltage at which the lithium precipitation begins in the battery (cell) constituting the battery 20.

The charge voltage upper limit is calculated in accordance with the charge current input to the battery 20, a battery temperature, and the internal resistance of the battery 20. For example, the charge voltage upper limit is set lower as the charge current of the battery 20 increases, while calculated higher as the charge current to the battery 20 is smaller.

When the battery 20 is composed of a plurality of batteries, the highest voltage among the plurality of battery cells must be suppressed under the charge voltage upper limit. The chargeable power calculation unit 55 specifies the cell with the highest voltage among voltages of cells detected by the voltage detecting unit 52. The chargeable power calculation unit 55 calculates an inputtable current which can be input to the battery based on the voltage of the specified cell, the internal resistance of that cell, and the internal resistance, charge current and chargeable upper voltage of the cell.

The inputtable current is calculated from the internal resistance of the cell with the highest terminal voltage and the charge voltage upper limit of that cell. The internal resistance of the cell is calculated from the terminal voltage of that cell by the voltage detecting unit 52 and the charge current of that cell.

Figure 2:
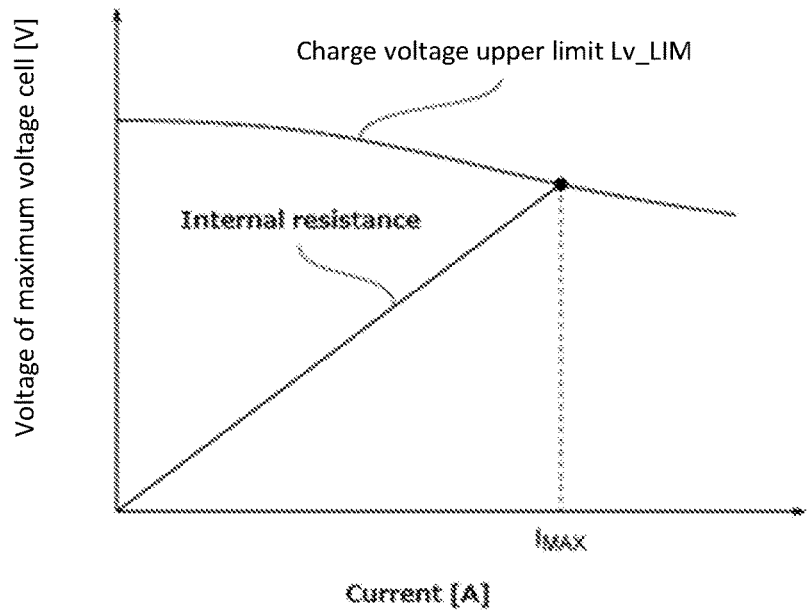
FIG. 2 is a graph showing voltage characteristics of the maximum voltage cell with respect to a charge current of the battery.

FIG. 2 is a diagram that explains the calculation method of the inputtable current ($I_{MAX}$). The chargeable power calculation unit 55 calculates, as shown in FIG. 2, the internal resistance line $L_R$ from an internal resistance of the cell that exhibits the highest terminal voltage.

The internal resistance line $L_R$ is representative, with respect to the cell having the highest terminal voltage, of a straight line indicating the relationship between the charge current of that cell and the voltage of the cell. Note that the internal resistance wire $L_R$ can be calculated, for example, from the total internal resistance of the battery 20 and the open circuit voltage of the battery 20. The total internal resistance of the battery 20 is the total resistance values of the plurality of cells included in the battery 20.

The charge voltage upper limit line $L_{V\_LIM}$ correlates to a charge current of the battery 20. Therefore, by preparing the map with the correlation between the charge voltage upper limit with the charge current of the battery 20 stored previously in the memory 40, the chargeable power calculation unit 55 may refer to the map and use the detected current of the current detecting unit 51 to calculate the charge voltage upper limit (corresponding to the charge voltage upper limit line $L_{V\_LIM}$).

In the characteristics shown in FIG. 2, the current at the intersection between the charge voltage upper limit line $L_{V\_lim}$ and the internal resistance line $L_R$, represents the inputtable current with the highest terminal voltage. Thus, the inputtable current can be calculated by chargeable power calculation unit 55.

The chargeable power calculation unit 55 can calculate the chargeable power by multiplying the total internal resistance of the battery 20 by the square of the inputtable current ($I_{MAX}$). Note that the calculation method of the chargeable power may be based on those other than the method above. The chargeable power calculation unit 55 outputs the calculated chargeable power to the command value calculation unit 59.

Reverting to FIG. 1, the charge time calculation unit 56 calculates a charge time based on a map indicating a correspondence relationship among the state of the battery 20, charge time of the battery 20 and the charge power thereof. Also, the charge time calculation unit 56 uses the map to calculate the charge characteristics of the battery with respect to the charge time and to output to the limited charge power calculation unit 58. The charge time calculation unit 56 calculates a charge time based on a temperature of the battery 20, indicating the state of the battery 20. The charge power of the battery 20 is representative of the power that is being actually supplied to the battery 20 and may be obtained from the detected current of the current detecting unit 51 and the detected voltage of the voltage detecting unit 52.

The allowable charge time calculation unit 57 calculates the allowable charge time for the charging time of the battery, and outputs to the limited charge power calculation unit 58. The allowable charge time is intended to be a time allowed by the user and is set in advance. When the charge time is extremely long, it is inconvenient for the user to wait until that charge time will elapse. Therefore, in the present embodiment, in view of convenience of the user, the charge time allowable for the user is previously set in advance by experiments etc. for storage in the allowable charge time calculation unit 57. Note that the allowable charge time is described below, as well.

The limited charge power calculation unit 58 calculates, based on the characteristics of the battery charge power with respect to the charge time of the battery 20 and the allowable charge time calculated by the allowable charge time calculation unit 58, calculates the charge power to charge the battery 20 at the allowable charge time as a limited charge power for outputting to the command value calculation unit 59. The limited charge power indicates a limited power of the charge power to be actually supplied to the battery 20 when charging the battery 20 at the allowable charge time.

The command value calculation unit 59, based on the chargeable power of the battery 20 calculated by the chargeable power calculation unit 55 and an outputtable power of the charger, calculates a command value of the power output from the charger 10. Also, the command value calculation unit 59 calculates the command value of the power output from the charger 19 in order to set the charge power of the battery 20 to the limited charge power calculated by the limited charge power calculation unit 58.

The outputtable power from the charger 10 represents the maximum output power that may be output from the charger, and corresponds to a rated power of the charger 10. In other words, the outputtable power is set in advance dependent upon the performance of the charger 10, and the outputtable power of the charger 10 is restricted below this outputtable power. There are two types of chargers, a quick charger with a high outputtable power and a normal charger with the ouputtable power lower that the quick charger. The LBC 50, upon confirming the connection between the charger 10 and the battery 20 via cable and the like, receives a signal transmitted from the charger 10 to acquire the outputtable power of the charger 10.

The command value calculation unit 59 transmits the calculated command value of the output power to the charger 10. The charger 10 in turn supplies the power to the battery 20 by converting the power from an AC source 100. Thus, the charger 10 is controlled by a command value of the command value calculation unit 59 to thereby charger the battery 20.

Now a description is given of a control carried out by the LBC 50. The LBC performs a charge control of the battery 20 without limiting the charge time to the allowable charge time as well as a charge control of the battery 20 based on the allowable charge time calculated by the allowable charge time calculation unit 50. First, a description is given of a normal charge control.

The LBC50, upon receipt of a signal indicative of charge start of the battery 20 based on operations of the user or the like, sets a target charging rate or SOC of the battery 20, and starts charging after confirming the connection between the charger 10 and the battery 20. Here, it is assumed that the target charging rate is set to the charging rate of full-charge.

The command value calculation unit 49 acquires an outputtable power from the charger 10. Further, the charger control unit 57 acquires, from the charger 10, a chargeable power calculated by the chargeable power of the charger 10. Then, the command value calculation unit 59 compares between the outputtable power and the chargeable power, and based on the comparison result thereof and the current SOC of the battery 20, calculates an outputtable power of the charger 10 for outputting to the battery 20.

The battery 20 of the present embodiment is a secondary battery mounted on a vehicle, etc., and the battery capacity of the battery 20 is large. Thus, the charger 10 has a limit to increasing the potential power output or outputtable power through increase in rated power of the alternate power source 100 and boost voltage of a converter of the charger. Therefore, when the SOC of the battery 20 is low, the outputtable power of charger 10 becomes lower than the chargeable power of the battery 20.

When the SOC of the battery 20 is high, the inputtable power to the battery 20 is low. Therefore, the chargeable power of the battery 20 is lower than the outputtable power of the charger 10.

When the chargeable power of the battery 20 is above the outputtable power of the charger 10, the command value calculation unit 59 calculates a command value of the output power so as to output from the charger 10 the outputtable power of the charger 10. The charger 10 in turn starts charging the battery 20 with the outputtable power. Thus, the battery 20 is charged under a constant power control.

On the other hand, when the chargeable power of the battery 20 is less than the outputtable power of the charger 10, the command value calculation unit 59 calculates the command value on the output power and output to the charger so that the chargeable power of the battery 20 will be output from the charger. The charger 10 in turn lowers an output current to charge the battery, so that the output power to the battery 20 matches the chargeable power. Further, the command value calculation unit 59 calculates the command value so as for the output power of the charger 10 to be lower as the SOC of the battery increases. The charger 10 in turn, based on that command value, decreases the output current gradually Note that, since the output voltage is constant, the battery 20 will be charged under a constant voltage control.

The chargeable power calculation unit 55 calculates, during charging of the battery 20, the chargeable power of the battery 20 based on the detected value of the current detecting unit 51, etc., for transmitting to the command value calculation unit 59. When the chargeable power of the battery 20 is higher than the outputtable power of the charger 10, the LBC controls the charger 10 under a constant power charge control. On the other hand, when the chargeable power of the battery 20 is lower than the outputtable power of the charger 10, the LBC 50 controls the charger 10 under the constant voltage charge control.

Then, based on the SOC calculated by the SOC calculation unit 54, when the battery assumes the state of full-charge, the LBC ends the charge of the battery 20. Note that, in the full-charge state of the battery 20, when charging the battery 20 with the constant voltage charge control, when the charge current of the battery 20 falls to a current threshold indicative of full-charge, it is determined that the battery 20 has reached the full-charge. Note that the determination of full-charge is not limited to the example described above. For example, the full-charge state may be determined when the increase rate over time in the amount of SOC calculated by the SOC calculation unit 54 has fallen below a predetermined value.

Figure 3:
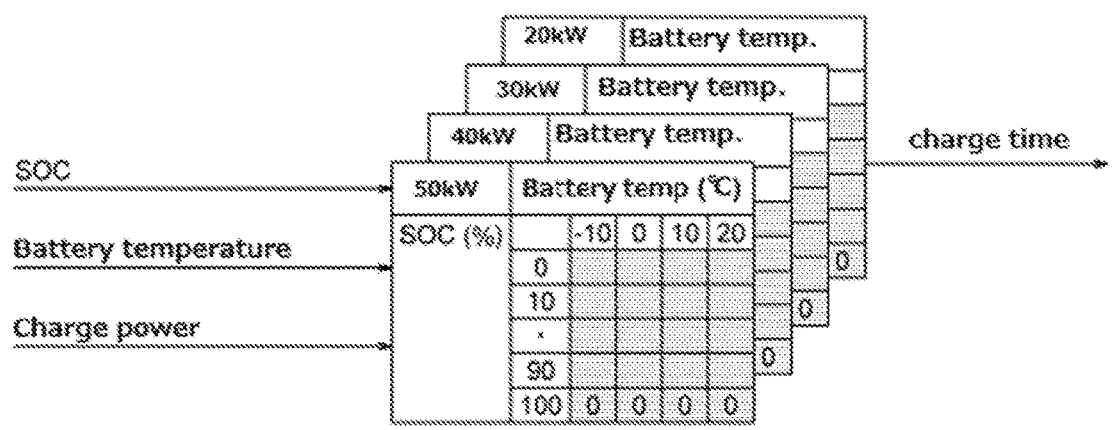
FIG. 3 is a schematic diagram of a map that is stored in a charge time calculation unit in FIG. 1.
Figures 4, 5:
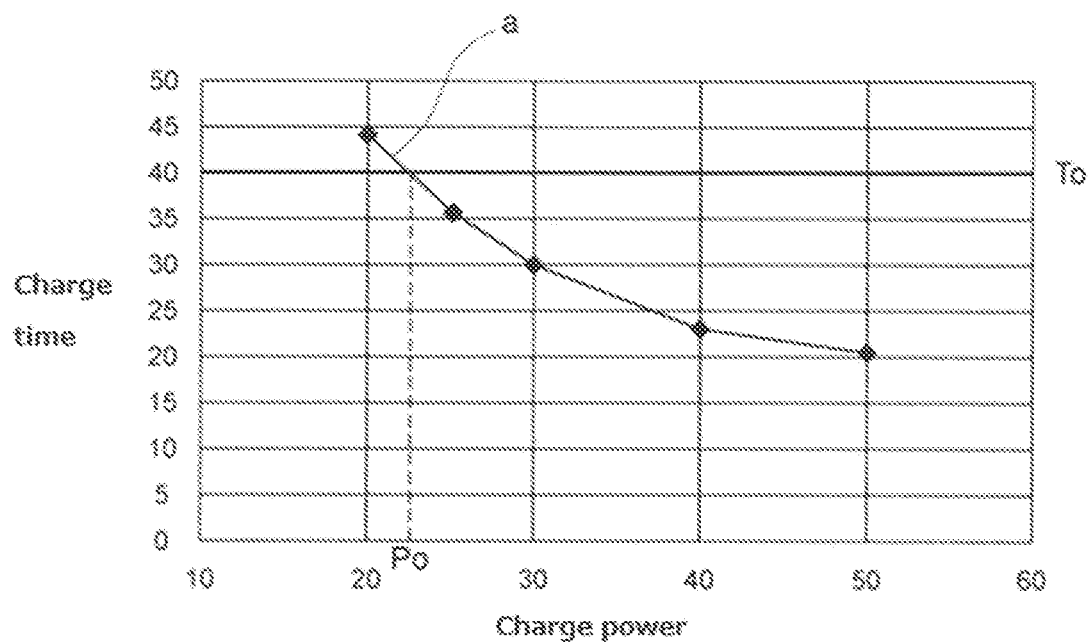
FIG. 4 is a schematic diagram of a map that is stored in an allowable charge time calculation unit in FIG. 1.
FIG. 5 is a graph showing characteristics between the charge power calculated by the charge time calculation unit and the charge time and showing a relationship with the allowable charge time.

Further, the charge time calculation unit 56, during charging, calculates the charge time indicating the time until the battery 20 with a SOC at charge start will be charged to the SOC corresponding to the full-charge. A map is stored in the charge time calculation unit 56, which shows the correspondences among a battery temperature indicative of battery state, the charge power of the battery 20, and charge time of the battery 20. With reference to FIG. 3, a map of the charge time calculation unit 56 is described. FIG. 4 is a schematic diagram for explaining the map.

As shown in FIG. 3, a plurality of maps is provided each showing the charge time with respect to the SOC and the battery temperature for each charge power. The charge time represents a time required to charge from the corresponding SOC to the SOC equivalent to full-charge. For example, when the present charge power (the power being output from the charger 10, with which the battery 20 is charged) of the battery during charging is 50 kW, the temperature of the battery 20 is 10 degrees, and the SOC of the battery 20 is 10%, the charge time calculation unit 56 extracts or selects from the maps in FIG. 3 a map with charge power (50 kW) and calculates the time (70 minutes) corresponding to the battery temperature (10 degree) and the SOC (10%) as the charge time. The LBC 50 displays on a display (not shown) the charge time calculated by the charge time calculation unit 56, or transmits a signal including the charge time to a mobile terminal and the like to indicate on the mobile terminal owned by the user.

Now, a charge control of the battery 20 is described based on the allowable charge time. In the allowable charge time calculation unit 57, as shown in FIG. 4, a map indicative of relationship among the outputtable power from the charger 10, the battery temperature of the battery 20, and the allowable charge time is previously stored. With reference to FIG. 4, the map of the allowable charge time calculation unit 57 is described. FIG. 4 is a schematic diagram illustrating that map.

As for the relationship between the temperature of the battery 20 and the allowable charge time, with respect to the allowable charge time at a reference temperature of the battery, the higher the temperature of the battery 20 is, the longer the allowable charge time is set, while, as the lower the temperature of the battery 20 is, the longer the allowable charge time will be set. More specifically, with the battery temperature at 0° C. to 10° C. (in FIG. 4) as a center, the allowable charge time is set in such a manner that, as the battery temperature increases, the allowable charge time will be longer, and, as the battery temperature decreases, the allowable charge time will be likewise longer.

The temperature range set in the map is set to an expected or supposed temperature range, or a little wider range than supposed bearing the use state of the battery 20, the environmental conditions of the battery 20 in mind.

Further, the allowable charge time corresponding to the upper limit temperature of the temperature range or the higher side of the temperature range is set based on the relationship between the temperature of the battery 20 and probability of side reactions occurrence. The side reaction of the battery 20, for example, is a reaction that causes deterioration of the battery 20 such as decomposition reaction of the electrolyte of the battery 20. Here, as the performance of the secondary battery, with the temperature of the battery being at high, when the battery is charged at a high charging power, the side reactions are likely to occur, and the deterioration of the battery 20 will proceed excessively. Further, the typical user is aware that the charging time becomes longer in order to prevent deterioration of the battery 20 during charging, when the battery temperature is high. Therefore, among the temperature ranges to be set in the map, as the temperature shifts to the higher side, the allowable charging time is set longer.

Further, the allowable charge time corresponding to the lower limit temperature of the temperature range or the lower side of the temperature range is set based on the relationship between the temperature of the battery 20 and reaction speed of the battery 20. As the performance of the secondary battery, with the temperature of the battery lowering, the reaction speed within the battery slows down with the internal resistance being higher. Thus, when the battery temperature is low, the charge current of the battery 20 cannot be raised so that it takes time to charge. Further, the typical user is aware that the charging time becomes longer when the battery temperature is low. Therefore, among the temperature ranges to be set in the map, as the temperature shifts to the lower side, the allowable charging time is set longer.

Now, a description is give of the relationship between the outputtable power of the charger and the allowable charge time. The typical user is aware that the charge time will be shorter as the outputtable charge power of the charger is higher. Thus, the allowable charge time is set shortened as the outputtable power of the charger 10 is higher.

That is, in view of the above discussions, the allowable charge time in the map of FIG. 4 is set to assume a charge power so as not cause an excessive degradation of the battery 20. In other words, the allowable time is set to be sufficiently long so as not to cause the battery 20 to degrade excessively, and is set to the extent that would not give the user a sense of discomfort.

Also, the range of the outputtable power or potential power output that is set on the map in FIG. 4 is set to a higher range than a rated power (outputtable power) of an ordinary charger (normal charger) 10. Specifically, the map in FIG. 4 is a map that corresponds to the rated output (outputtable power) of the charger (quick charger) 10 for quick charging. Further, the rated output of the quick charger is different depending on the types of the chargers 10. Thus, the charger output (outputtable power) set in the map is provided for a predetermined range including different outputtable powers depending on the types of the chargers 10.

Now, a description is given of the relationship between the allowable charge time and SOC. When charging the battery 20, and the SOC approaches the SOC of full-charge, the SOC increase rate will be lower over time of charging, Also, when charging the battery 20 using the quick charger, in view of the load applied to the battery 20, the upper limit target charging rate (i.e. target SOC) is sometimes set lower than the full-charge state. In these cases, the allowable charge time is set to a charge time till the battery is charged to a SOC lower than that corresponding to full-charge.

Note that the target upper limit target charging rate (target SOC) may be set considering the time required for the SOC reaching a predetermined SOC from the start of charge, at which the SOC increase rate per unit time during charging becomes lower than a predetermined increase rate. In other words, by charging only within a region with the increase rate of SOC higher than the predetermined increase rate, the allowable charge time may be set as short as possible so that it is possible to suppress the dissatisfaction of the user due to long charge time.

As described above, the allowable charge time is set by defining the charge time allowable to the user for each of the states of the battery 20 and the outputtable power of charger 10. Further, by setting the target charging rate when setting the charge time as a charging rate lower than the full-charge, an appropriate allowable charge time will be provided, and charge may be performed in high charge efficiency without giving the user a discomfort that would be attributable to charging to full-charge state.

The LBC50, after checking the connection between the charger 10 and the battery 20, and starting the charge control, obtains the outputtable power of charger 10 first. The LBC50 then determines whether or not the outputtable power of the charger 10 is within a range of the charger output (outputtable power). When the outputtable power is not within the outputtable power range set by the map, the LBC 50 determines the charger as normal charger, and performs a normal charge control.

On the other hand, when the outputtable power of the charger is in the range of the charger output (outputtable power) set in the map in FIG. 4, the LBC50 calculates an allowable charge time by the allowable charge time calculation unit 57.

The allowable charge time calculation portion 57 acquires the outputtable power of the charger 10, the temperature of the battery 20 detected by the temperature detecting unit 53, and the SOC at the start of charge. The allowable charge time calculation unit 57 referrers to a map in FIG. 4 and calculates the charge time that corresponds to the outputtable power, the battery temperature, and the SOC as the allowable charge time to output to the limited charge power calculation unit 58.

Further, when the outputtable power of the charger is in the range of the charger output (outputtable power) set in the map in FIG. 4, the charge time calculation unit 56 acquires the battery temperature and the SOC. In addition, the charge time calculation unit 56 extracts the charge time respectively corresponding to the battery temperature and the SOC, calculates the characteristics between the charge power and the charge time to output the calculation result to the limited charge power calculation unit 58.

The limited charge power calculation unit 58, based on the characteristics between the charge power and charge time calculated by the charge time calculation unit 56 and the allowable charge time calculated by the charge time calculation unit 57, calculates a limited charge power.

FIG. 5 is a graph showing the characteristics of charge time and charge power and the relationship to the allowable charge time. The characteristics between the charge time and charge power is shown by a curve 1. The allowable charge time (T0) is a value uniquely calculated in the map of FIG. 4 and thus illustrated as a constant value. On the other hand, the characteristics between the charge time and charge power are obtained by connecting the values respectively extracted from each map in FIG. 3 with approximate curve.

Then, the intersection of the characteristics of the charge time and charging power and the characteristics of the allowable charge time (To) represents a limited charge power (Po). The limited charge power calculation unit 58 outputs the limited charge power (Po) to the command value calculation unit 59. The command value calculation unit 59 calculates a command value of the output power of the charger 10 for outputting to the charger 10 to cause the charge power of the battery 20 to the limited charge power (P0).

The LBC50 manages the SOC of the battery 20 by the SOC calculation unit 54 during charging of the battery 20 with the limited charge power (Po). The command value calculation unit 59 calculates the command value so as for the output power of the charger 10 to be lower than the limited charge power (P0), and the charger 10 lowers the output current gradually in response thereto. Then, when the battery 20 reaches the target SOC, the LBC 50 terminates the charging of the battery 20. Note that, in view of the situations in which the charge is not completed even at elapse of the allowable charge time due to errors or the like in the control due to sensor errors, even before the battery reaches the target SOC, it is preferable to terminate charging when the allowable charge time has elapsed. In this case, the battery is charged only to the SOC lower than the target SOC. However, the difference is within a controlled specific error range so that no problem arises since the battery 20 is charged to the SOC approximately equal to the target SOC.

Thus, when charging the battery 20 with the charge power to the battery 20 at the limited charge power, as the battery deteriorates excessively, the charge of the battery 20 may be terminated in the allowable charge time without increase in temperature being accompanied.

Figure 6:
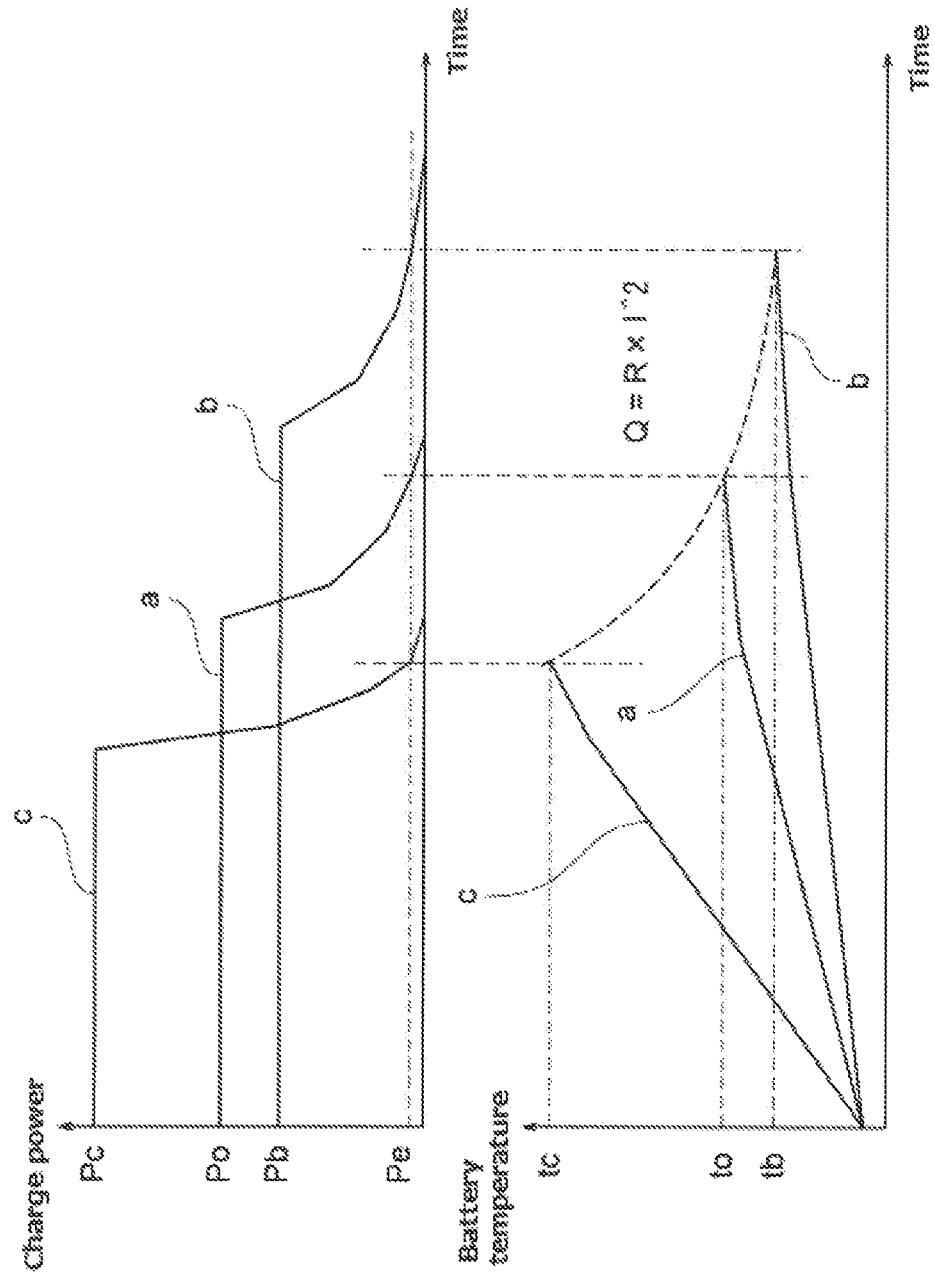

Here, a description is given of the relationship between the charge time and the charge power, and the relationship between the charge time and the battery temperature. FIG. 6A is a graph showing characteristics of the charge power with respect to the charge time, while FIG. 6B is a graph showing characteristics of the battery temperature with respect to the charge time. The curve a in FIGS. 6A, 6B shows the characteristics according to the present invention. The curve b shows the characteristics (Comparative Example 1), which is set based on the temperature only, as contrast to the present invention. The curve c represents the characteristics (Comparative Example 2) which represents a situation in which the charger 10 is charge with the maximum output (Pc) without providing limitations in temperature or charge time, as contrast to the present invention. The power (Pe) is intended for determining the full-charge, and corresponds to a current threshold for determining the full-charge of the battery 20 in a constant current control. It is assumed that, in the present invention and Comparative Examples shown in curves a and b, the battery temperature, the SOC, and the target charging rate at start of charge are the same. Also, the outputtable power from the charger 10 in use is assumed to be the same.

In the present embodiment, since the charge power is set so as to terminate charging in the allowable charge time by calculating the allowable charge time, the characteristics of the charge power with respect to charge time is shown as the curve a. On the other hand, in Comparative example 1, since the charge power is set based on the temperature only and the charge power is set so that the battery temperature hardly rise during charging, the charge power (Pb) at the start of charging is lower than the power (P0) according to the present invention. In addition, for the lower charge power, the charge time (Tb) in Comparative Example is longer as compared to the charge time (T0) according to the present invention. Further, the charge time (Tc) in Comparative Example 2 is shorter as compared to the charge time (T0) according to the present invention.

As for battery temperature, regarding the temperature of the battery at the end of charge, due to the higher charge power, the battery temperature in the present invention (to)

is higher than the battery temperature (tb) in Comparative Example 1. In addition, the battery temperature (tc) of Comparative Example 2 is higher than the battery temperature (to).

During charging of the battery 20, the amount of heat applied to the battery 20 correlates to the value obtained by multiplying the internal resistance (R) the battery 20 and the square of the value of the charging current (I). Therefore, when compared to curves a, and b, even at reduced charge current of the battery 20, the decrease amount of the battery temperature is not large, but rather, the charge time will be longer. In other words, as compared to Comparative Example 1, even when the charge current of the battery 20 is increased to terminate the charging of the battery 20 in the allowable charge time, rise of the battery temperature is small, and the charge time can be shortened.

Figure 7:
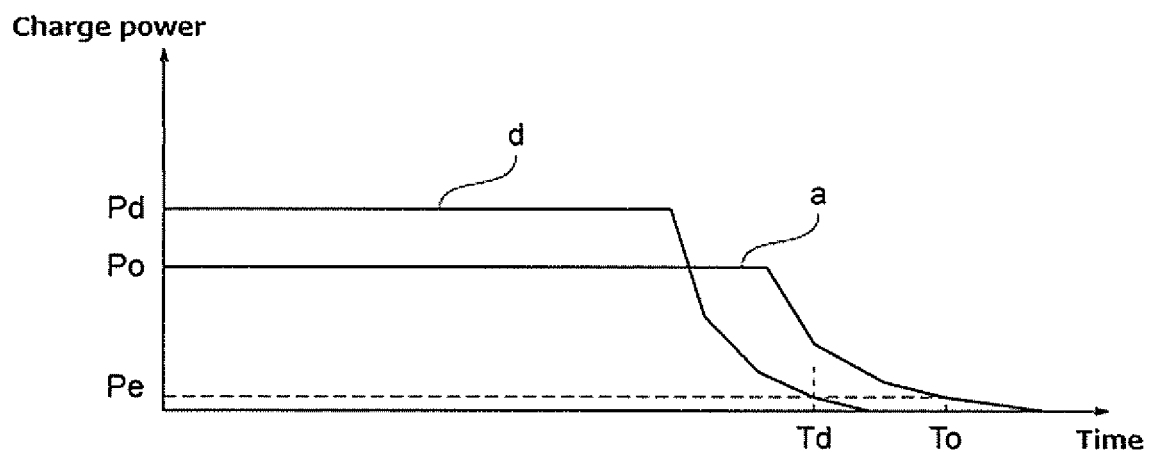
FIG. 7 is a graph showing characteristics of a charge power with respect to charge time.

Furthermore, with reference to FIG. 7, a description is given of the relationship among the charge power, charge time, and the battery temperature. FIG. 7 is a graph showing the characteristics of the charge power to the charging time. The curve a in FIG. 7 shows the characteristics of the present invention, while the curve d, unlike the present invention, illustrates the characteristic in which the charge power is set based on the charge time shorter than the allowable charge time (Comparative Example 3). The power (Pe) is a threshold for determining the full-charge. In addition, in the present invention and the Comparative Example as shown in curves a, d, the battery temperature, the SOC, and the target charging rate are assumed to be the same. Moreover, the outputtable power of the charger 10 in use is assumed to be the same.

In Comparative Example 3, since the charge time is set to be a shorter time (Td) than the allowable charge time (T0), the charge power (Pd) is higher than the limited charge power (P0). Further, in Comparative Example 3, since the charge power (Pd) is higher than the limited charge power (P0), the battery temperature is higher during charging than the present invention, so that the deterioration of the battery may excessively progress.

As described above, in the present embodiment, by calculating the limited charge power (Po) on the basis of the allowable charge time, the output power of the charger 10 is controlled when charging the battery 20. Thus, by compromising the battery temperature and the charge time, while minimizing the battery deterioration due to temperature rise of the battery 20, it is possible to charge the battery 20 in the charging time that does not give a sense of discomfort to the user.

Figure 8:
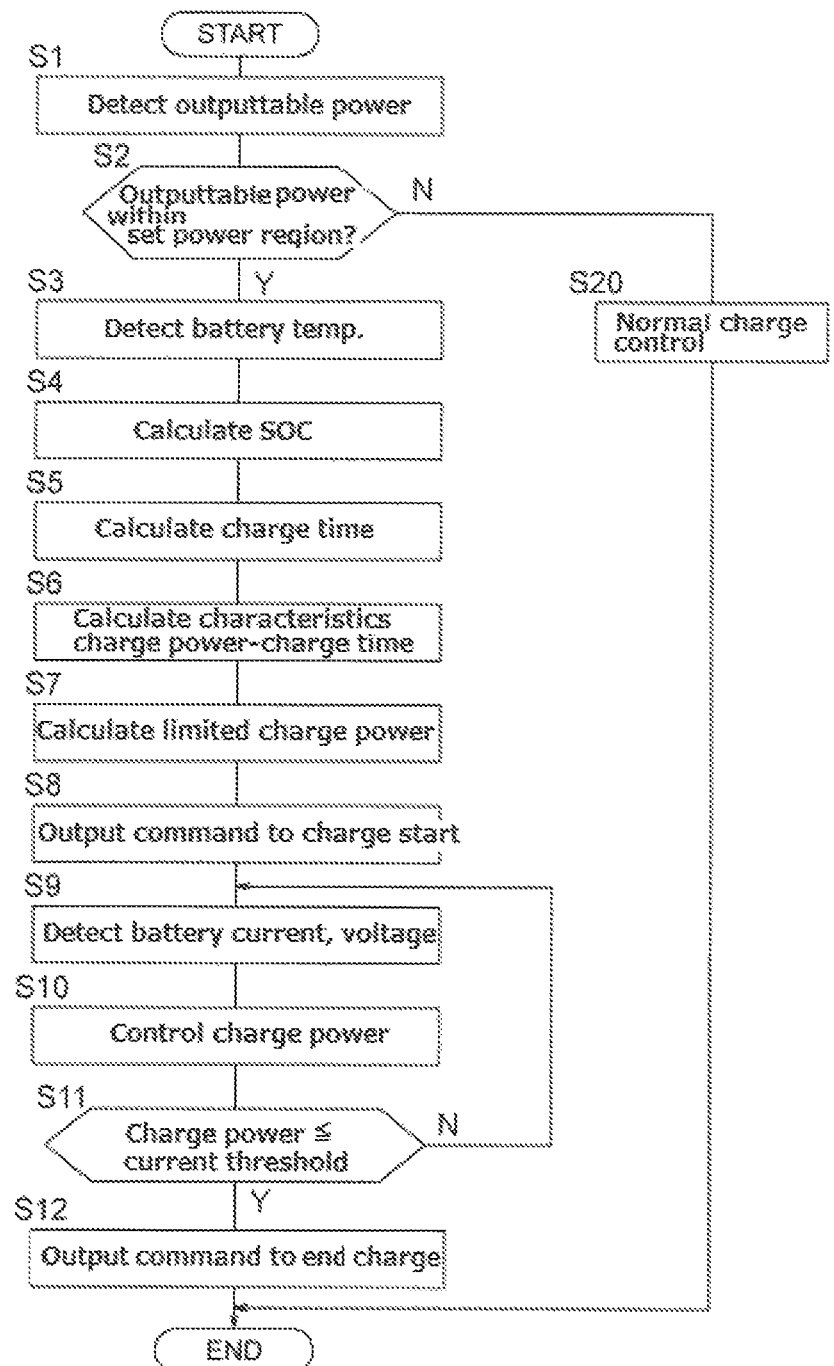
FIG. 8 is a flowchart showing a control procedure of LBC in FIG. 1.

Now, referring to FIG. 8, a description is given of a charge control of the LBC 50. FIG. 8 is a flowchart illustrating a control process of the charge control by the LBC 50.

In step S1, the LBC50, based on a signal from the charger 10, detects the potential power output or the outputtable power of the charger 10. In step S2, the LBC50 determines whether or not the outputtable power of the charger 10 is within the range of the set power set in the map (map in FIG. 4). When the outputtable power is outside the range of the set power of the map, at step S20, the LBC50 does not limit the charge time to the allowable charge time, and a normal charge control.

On the other hand, the outputtable power of the charger 10 is within range of the set power of the map, in step S3, the temperature detecting unit 53 detects the temperature of the battery 20. In step S4, the SOC calculation unit 54 calculates the SOC of the battery 20. In step S5, the allowable charge time calculation unit 57, based on the outputtable power in step S1, the battery temperature in step S3, and the SOC in step S4, refers to the map of FIG. 4 and calculates the allowable charge time.

In step S6, the charge time calculation unit 56, based on the battery temperature in step S3 and the SOC in step S3, refers to the map of FIG. 3 and calculates the charge power-charge time characteristics. In step S7, the limited charge power calculation unit 58, based on the allowable charge time and the charge power-charge time characteristics, calculates a limited charge power.

In step S8, the command value calculation unit 59, based on the limited charge power, calculates a command value of output power of the charger 10, and, by outputting to the charger 10, starts to charge the battery 20. In step S9, during charging of the battery 20, the current detecting unit 51 and the voltage detecting unit 53 detect the current and the voltage of the battery.

In step S10, the LBC 50, based on the detected voltage and the detected current in step S9, controls the charger 10 to control the charge power of the battery 20. In step S11, the LBC 50 determines whether or not the charge current to the battery 20 is equal to or below a current threshold indicative of full-charge (current threshold for determination of full-charge).

When the charge current of the battery 20 is higher than the current threshold, process returns to step S9, and the charging of the battery 20 is continued. On the other hand, when the charge current of the battery 20 is below the current threshold, the command value calculation unit 59 outputs to the charger 10 a command value to end the charge. Subsequently, process ends the charge control in the present embodiment.

As described above, in the present embodiment, by referring to a map (corresponding to the map in FIG. 3) indicating the relationship of the charge power corresponding to the state of the battery 20 and the charge time of the battery 20, a charge power with which to charge the battery in an allowable charge time is set, and the output power of the charger 10 is controlled with the charge power that is set based on the allowable charge time. Thus, while minimizing the deterioration of the battery ample, it is possible to charge the battery 20 without the user having uncomfortable feeling.

Also, in the present embodiment, the allowable charge time is calculated according to the temperature of the battery 20. The user recognizes the charge time as a guide according to the temperature conditions. Therefore, with respect to the temperature conditions of the battery 20, the battery 20 may be charged in a charge time that would not give an uncomfortable feeling to the user while suppressing the battery deterioration due to temperature rise.

In the present embodiment, as the temperature of the battery 20 is higher than a predetermined temperature, the allowable charge time is set longer. Further, as the temperature of the battery 20 is lower than the predetermined temperature, the charge time is set to be increased. As described above, when the temperature of the battery 20 is too high, the charge time is longer. Also, even when the temperature of the battery 20 is too low, the charge time is longer, too. Therefore, it is possible to calculate the allowable charge time according to these characteristics so that the battery 20 can be charged in a charge time that would not cause the user to feel uncomfortable while minimizing the deterioration of the battery.

Also, in the present embodiment, the allowable charge time to the upper limit temperature of the battery 20 is set based on the relationship between the battery temperature and the easiness with which the side reaction would occur. Further, the allowable charge time to the lower limit of the battery 20 is set based on the relationship between the battery temperature and the reaction speed or rate of the battery 20. Thus, the allowable charge time for the upper limit temperature and that for the lower limit temperature may be set to the appropriate time, respectively, based on the nature of the battery 20. Consequently, it is possible to charge the battery 20 in the charge time that does not give a sense of discomfort to the user.

Further, in the present embodiment, the allowable charge time is calculated depending on the outputtable power of the charger 10. The user is normally aware of the charge time as a guide depending on the rated power of the charger 10. Thus, depending on the conditions of the outputtable power of the battery 20, it is possible to charge the battery 20 in a charge time that would not give a discomfort to the user while suppressing the deterioration of the battery with increasing temperature.

In the present embodiment, depending on a map (corresponding to the map in FIG. 4) indicative of the relationship between the outputtable power of a charger 10 the outputtable power of which is higher than a predetermined power and the allowable charge power, the allowable charge time is calculated. Thus, when charging with the charger 10 of higher outputtable power than the predetermined power, it is possible to end the charging at the allowable charge time. With a charger with high outputtable power such as a quick or rapid charger and the like, the charge power to the battery 20 is high as well, so that the battery tends to be hot. On the other hand, in a region of high SOC, when charging with plenty of time, the increase rate of SOC is low. Thus, by setting the target SOC in the map at a lower SOC than a full-charge state and by setting the charge time required to reach this set SOC as the allowable charge time, it is possible to suppress deterioration of the battery with increasing temperature while allowing to charge the battery 20 in a charge time that does not give a sense of discomfort to the user.

Further, in the present embodiment, the allowable charge time is set shorter as the outputtable power is higher. The user is normally aware that the charge time will be shorter as the rated power of the charger 10 increases. Thus, depending on the conditions of the outputtable power of the battery 20, it is possible to charge the battery 20 in a charge time that would not give a discomfort to the user while suppressing the deterioration of the battery with increasing temperature.

Furthermore, in the present embodiment, the charge time is calculated based on the SOC, and, the allowable charge time is set shorter as the SOC is higher. The user is normally aware of the charge time depending on the SOC. Thus, depending on the conditions of the SOC of the battery 20, it is possible to charge the battery 20 in a charge time that would not give a discomfort to the user while suppressing the deterioration of the battery with increasing temperature.

Note that, in the present embodiment, the output of the charger to be employed in a map stored in the allowable charge time calculation unit 57 is set to correspond to an outputtable power of a quick charger 10. However, it is not necessarily required to correspond to the output of the quick charger. The map may correspond to the output of the normal charger 10, as well.

Also, the map shown in FIG. 3 illustrates a map when charging the battery 20 fully. However, the map may be provided for each target charging rate.

Figure 9:
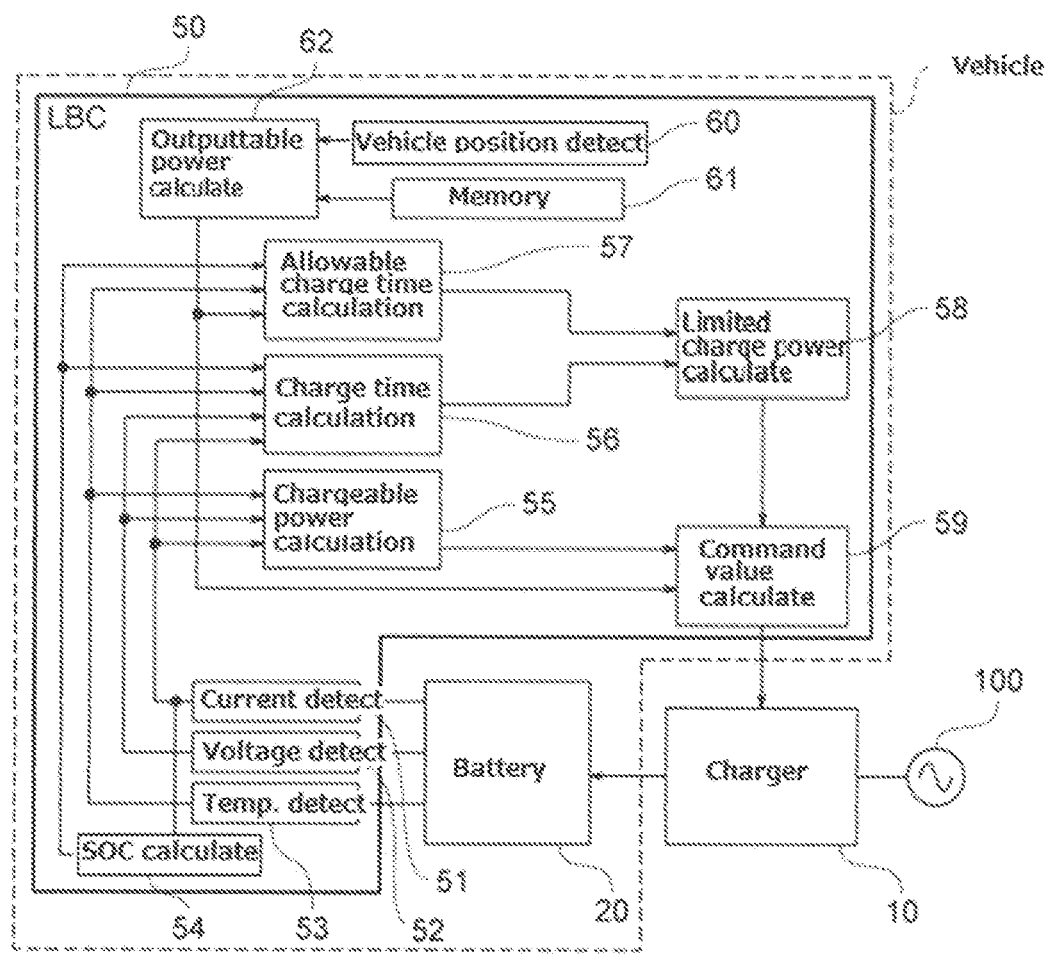
FIG. 9 is a system block diagram of the charge system pertaining to a modification according to the present invention.

As a modification of the present invention, as shown in FIG. 9, the LBC50 has a vehicle position detecting section 60, a memory 61, and the outputtable power or the potential power output calculation unit 62, in addition to the above configuration. FIG. 9 is a block diagram of a charge system according to the modification.

The vehicle position detecting section 60, by using the GPS system (Global Position System), communicates with the GPS satellites, and detects the position of the vehicle. The memory 61 is a recording medium for recording map data, position information of facilities as well as facility information (POI information) on the map data. In the memory 61, the position of the charger 10 of the external facilities and the outputtable power or the potential power output of that charger 10 are associated to each other and recorded in association.

The outputtable power acquisition unit 62 refers to the data stored in the memory 61, identifies the charger 10 (being in use or about to be used) that corresponds to the detected position of the vehicle detected by the vehicle position detecting unit 60, and extracts the outputtable power of the identified charger 10. Thus, the outputtable power acquisition unit 62 acquires the outputtable power to output to the allowable charge time calculation unit 57 and the command value calculation unit 59. Further, the allowable charge time calculation unit 57, based on the outputtable power acquired by the outputtable power acquisition unit 62, calculates the allowable charge time. The command value calculation unit 59 calculates a command value based on the allowable charge time. Thus, in the present embodiment, without receiving a signal containing the information of the outputtable power from the charger 10, the outputtable power of the charger 10 to be used may be obtained.

The temperature detecting section 53 corresponds to the temperature detecting means according to the present invention. The SOC calculation unit 54 corresponds to the "charge state calculation means", according to the present invention. The allowable charge time calculation unit 57 corresponds to the "allowable charge time calculation means" according to the present invention. The limited charge power calculation unit 58 and the command value calculation unit 59 correspond to "the charger control means" according to the present invention. The vehicle position detecting unit 60 corresponds to the "position detecting means" according to the present invention. Finally, the memory 61 corresponds to the "memory means" according to the present invention.

The invention claimed is:

1. A charge control device that charges a battery having a predetermined state of charge (SOC) using an output power from a charger having a predetermined charging rate, comprising:
    a temperature detecting means that detects a temperature of the battery;
    a charger control means that controls the output power of the charger based on a first map indicative of a relationship of a charge power of the battery with respect to a charge state of the battery and a charge time of the battery;
    an allowable charge time calculation means that calculates an allowable charge time of the battery based on the temperature; and
    a charge state calculation means that detects a state of charge (SOC) of the battery, wherein the allowable charge time calculation means adjusts the charge time based on a plurality of first maps, each indicative of a relationship of the charge power and the charge time corresponding to the detected temperature and the SOC of the battery, wherein the charger control means is configured to calculate a limited charge power with which the battery is charged in the allowable charge time based on a second map that is extracted from the plurality of first maps corresponding to the detected temperature and the SOC of the battery and to control the output power to the battery according to the limited charge power during the allowable charge time.

2. The charge control device as claimed in claim 1, wherein the allowable charge time calculation means is configured to set the allowable charge time longer as the temperature of the battery is higher than a predetermined temperature, and to set the allowable time longer as the temperature of the battery is lower than the predetermined temperature.

3. The charge control device as claimed in claim 1, wherein the allowable charge time corresponding to an upper limit temperature of the battery is set in advance based on a relationship between the temperature of the battery and degree of battery degradation.

4. The charge control device as claimed in claim 1, wherein the allowable charge time corresponding to a lower limit temperature of the battery is set in advance based on a relationship between the temperature of the battery and a reaction speed of the battery.

5. The charge control device as claimed in claim 1, wherein the output power is an outputtable power that can be output from the charger, the allowable charge time calculation means configured to calculate the allowable charge time according to the outputtable power.

6. The charge control device as claimed in claim 5, wherein the allowable charge time calculation means is configured to calculate the allowable charge time based on a second map indicative of a relationship between the outputtable power of the charger whose outputtable power is higher than a predetermined output and the allowable charge time.

7. The charge control device as claimed in claim 5, wherein the allowable charge time calculation means is configured to set the allowable charge time shorter as the outputtable power is higher.

8. The charge control device as claimed in claim 1, further comprising a charge state calculation means configured to calculate the charge state.

9. The charge control device as claimed in claim 1, wherein the allowable charge time calculation means is configured to set the allowable charge time shorter as the charge state of the battery is higher.

10. The charge control device as claimed in claim 1, further comprising:

a position detecting means that detects a position of a vehicle equipped with the charge control device;
a memory means that stores a correspondence between the position of the charger and an outputtable power that can be output from the charger, wherein the allowable charge time calculation means is configured to:
refer data stored in the memory means and identify the charger corresponding to the detected position of the vehicle detected by the position detecting means; and
calculate the allowable charge time according to the outputtable power of the charger that has been identified.

11. A charge control method for charging a battery to a predetermined state of charge (SOC) with a charge control device using an output power from a charger at a predetermined charging rate of the battery, comprising:
determining an SOC of the battery;
detecting a temperature of the battery;
determining a battery charge time based on the SOC, the detected temperature of the battery and the output power;
calculating an allowable charge time of the battery charge time according to the detected temperature of the battery;
setting a limited charge power for charging the battery in the allowable charge time, based on a second map indicative of a relationship of the charge time and the charge power corresponding to the detected temperature of the battery and the SOC, extracted from a plurality of first maps each indicative of a relationship of the charge time and the charge power corresponding to the SOC of the battery and the temperature of the battery; and
controlling the output power of the charger so as to match the limited charge power set according to the allowable charge time.

12. The charge control method as claimed in claim 11, further comprising:
detecting a position of a vehicle equipped with the charge control device; and
storing in a memory a correspondence between the position of the charger and an outputtable power that can be output from the charger, wherein calculating the allowable charge time further comprises:
refer to data stored in the memory and identify the charger corresponding to the detected position of the vehicle; and
calculate the allowable charge time according to the outputtable power of the charger that has been identified.

* * * * *